(12) United States Patent
Ahlgren et al.

(10) Patent No.: US 6,667,521 B2
(45) Date of Patent: Dec. 23, 2003

(54) BIPOLAR TRANSISTOR WITH RAISED EXTRINSIC BASE FABRICATED IN AN INTEGRATED BICMOS CIRCUIT

(75) Inventors: David C. Ahlgren, Wappingers Falls, NY (US); Gregory G. Freeman, Hopewell Junction, NY (US); Feng Yi Huang, Hacienda Heights, CA (US); Adam D. Ticknor, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/283,739

(22) Filed: Oct. 29, 2002

(65) Prior Publication Data

US 2003/0064555 A1 Apr. 3, 2003

Related U.S. Application Data

(62) Division of application No. 09/887,310, filed on Jun. 22, 2001, now Pat. No. 6,492,238.

(51) Int. Cl.[7] ............................................. H01L 29/76
(52) U.S. Cl. ........................................................ 257/370
(58) Field of Search ................................. 257/370, 205, 257/350

(56) References Cited

U.S. PATENT DOCUMENTS

| 5,015,594 A | 5/1991 | Chu et al. ................. 437/31 |
| 5,444,285 A | 8/1995 | Robinson et al. ......... 257/378 |
| 5,457,062 A | 10/1995 | Keller et al. .............. 437/47 |
| 5,523,606 A | 6/1996 | Yamazaki .................. 257/370 |
| 5,620,908 A | 4/1997 | Inoh et al. ................. 438/207 |
| 5,886,387 A * | 3/1999 | Nishigohri et al. ........ 257/370 |
| 6,015,726 A | 1/2000 | Yoshida ..................... 438/202 |
| 6,169,688 B1 | 1/2001 | Noguchi ..................... 365/171 |
| 6,191,457 B1 | 2/2001 | Prengle et al. ............. 257/370 |
| 6,251,747 B1 | 6/2001 | Zheng et al. ............... 438/424 |
| 6,274,445 B1 | 8/2001 | Nouri ......................... 438/300 |
| 6,326,253 B1 | 12/2001 | Kotani ....................... 438/202 |
| 6,365,932 B1 | 4/2002 | Kouno et al. ............... 251/341 |
| 6,376,883 B1 | 4/2002 | Gris .......................... 257/378 |

OTHER PUBLICATIONS

Y. C. Sun et al., "Process for a High–Performance Bipolar–Based BICMOS," IBM Technical Disclosure Bulletin, vol. 35, No. 4B, pp. 295–297 (Sep. 1992).

U.S. patent application Ser. No. 09/690,674, filed Oct. 17, 2000, (IBM Docket No. BUR9–2000–0106–US1).

* cited by examiner

Primary Examiner—David Nelms
Assistant Examiner—Quoc Hoang
(74) Attorney, Agent, or Firm—Joseph P. Abate; Ratner Prestia

(57) ABSTRACT

A process for forming a bipolar transistor with a raised extrinsic base, an emitter, and a collector integrated with a CMOS circuit with a gate. An intermediate semiconductor structure is provided having CMOS and bipolar areas. An intrinsic base layer is provided in the bipolar area. A base oxide is formed across, and a sacrificial emitter stack silicon layer is deposited on, both the CMOS and bipolar areas. A photoresist is applied to protect the bipolar area and the structure is etched to remove the sacrificial layer from the CMOS area only such that the top surface of the sacrificial layer on the bipolar area is substantially flush with the top surface of the CMOS area. Finally, a polish stop layer is deposited having a substantially flat top surface across both the CMOS and bipolar areas suitable for subsequent chemical-mechanical polishing (CMP) to form the raised extrinsic base.

8 Claims, 18 Drawing Sheets

BIPOLAR TRANSISTOR WITH RAISED EXTRINSIC BASE FABRICATED IN AN INTEGRATED BICMOS CIRCUIT

CROSS-REFERENCE TO RELATED PATENT APPLICATIONS

This patent application is a Divisional patent application of U.S. patent application Ser. No. 09/887,310 now U.S. Pat. No. 6,492,238, filed on Jun. 22, 2001.

TECHNICAL FIELD

The present invention relates generally to bipolar transistors and, more particularly, to a process for forming a bipolar transistor with a raised extrinsic base in an integrated bipolar and complementary metal-oxide-semiconductor (BiCMOS) transistor circuit.

BACKGROUND OF THE INVENTION

Transistors are used as either amplifying or switching devices in electronic circuits. In the first application, the transistor functions to amplify small ac signals. In the second application, a small current is used to switch the transistor between an "on" state and an "off" state.

The bipolar transistor is an electronic device with two p-n junctions in close proximity. The bipolar transistor has three device regions: an emitter, a collector, and a base disposed between the emitter and the collector. Ideally, the two p-n junctions (the emitter-base and collector-base junctions) are in a single layer of semiconductor material separated by a specific distance. Modulation of the current flow in one p-n junction by changing the bias of the nearby junction is called "bipolar-transistor action."

External leads can be attached to each of the three regions and external voltages and currents can be applied to the device using these leads. If the emitter and collector are doped n-type and the base is doped p-type, the device is an "npn" transistor. Alternatively, if the opposite doping configuration is used, the device is a "pnp" transistor. Because the mobility of minority carriers (i.e., electrons) in the base region of npn transistors is higher than that of holes in the base of pnp transistors, higher-frequency operation and higher-speed performances can be obtained with npn devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The silicon-germanium alloy (often expressed simply as silicon-germanium) is narrower in band gap than silicon.

The advanced silicon-germanium bipolar and complementary metal-oxide-semiconductor (BiCMOS) technology uses a silicon-germanium base in the heterojunction bipolar transistor. In the high frequency (such as multi-GHz) regime, conventional compound semiconductors such as GaAs and InP currently dominate the market for high speed wired and wireless communications. Silicon-germanium BiCMOS promises not only a comparable performance to GaAs in devices such as power amplifiers, but also a substantial cost reduction due to the integration of heterojunction bipolar transistors with standard CMOS, yielding the so-called "system on a chip."

For high performance HBT fabrication, yielding SiGe/Si HBTs, a conventional way to reduce the base resistance is through ion implantation onto the extrinsic base. The ion implantation will cause damage, however, to the base region. Such damage ultimately may lead to degradation in device performance.

To avoid the implantation damage, a raised extrinsic base (REXT) is formed by depositing an extra layer of polycrystalline silicon (or silicon-germanium) atop the conventional SiGe extrinsic base layer. There are essentially two processes that may be applied to achieve such a raised extrinsic base. The first process involves selective epitaxy; the other involves chemical-mechanical polishing (CMP).

1. Selective Epitaxy

In a typical selective epitaxy process, the raised extrinsic base polycrystalline silicon is formed before the deposition of the intrinsic base SiGe. The intrinsic base SiGe is deposited selectively onto the exposed surface of silicon and polycrystalline silicon inside an over-hanging cavity structure. The selective epitaxy with a cavity structure mandates stringent process requirements for good selectivity, and suffers from poor process control.

U.S. Pat. No. 5,523,606 issued to Yamazaki discloses a process using selective epitaxy. Referring to FIGS. 1A and 1B, which correspond to portions of FIGS. 7C and 7E, respectively, of the '606 patent, the extrinsic base poly silicon 21 is deposited before the intrinsic base 23 is deposited. Shown in FIG. 1A are silicon nitride film 15, silicon nitride side wall spacers 17, and semiconductor substrate 1. The films (not labeled) underneath the extrinsic base poly silicon 21 are etched away to form a cavity (or void) 22 of an over-hanging structure. The intrinsic base 23 is then selectively deposited, as shown in FIG. 1B, only inside the cavity 22 on the silicon and polysilicon exposed surface. See '606 patent from column 8, line 53 to column 9, line 17. FIG. 1B also shows an n-type epitaxial collector layer 13. The approach disclosed in the '606 patent avoids a CMP step, but has several drawbacks such as poor process control in filling the cavity 22 and stringent requirements for selective deposition conditions.

U.S. Pat. No. 5,620,908 was issued to Inoh et al. and titled "Manufacturing Method of Semiconductor Device Comprising BICMOS Transistor." Inoh et al. apply an approach similar to that disclosed by Yamazaki in the '606 patent. Specifically, as illustrated in FIG. 6F of the '908 patent and discussed in column 13 (specifically, at lines 24–26), Inoh et al. disclose a process that incorporates selective epitaxy and the step of etching an overhang to form a cavity.

2. CMP

The second type of process that can be applied to form a raised extrinsic base involves a CMP step. U.S. Pat. No. 5,015,594 was issued to Chu et al. and was assigned to the same assignee, International Business Machines Corporation, as the present invention. In their patent, titled "Process of Making BICMOS Devices Having Closely Spaced Device Regions," Chu et al. propose the formation of extrinsic base polysilicon by CMP. The isolation is achieved by thermal oxidation, however, which is not feasible in high performance devices due to the high temperature thermal process.

Y. C. Sun and J. Warnock disclose a process, in "Process for a High-Performance Bipolar-Based BICMOS," IBM Technical Disclosure Bulletin, vol. 35, no. 4B, pages 295–97 (September 1992), of forming a raised extrinsic base by CMP. The extrinsic base portion is formed in direct contact with the intrinsic base, however, without any etch stop. FIGS. 2A and 2B correspond to FIG. 1 of the article. With reference to FIGS. 2A and 2B, the extrinsic base polysilicon 21 is deposited directly above the intrinsic base region 5, which is also on the emitter opening region, without any interfacial films to stop the emitter opening etch 31 of the extrinsic base polysilicon 21. This process exhibits poor process control and, therefore, cannot yield good production control and cannot yield a highly reliable and reproducible bipolar device.

To stop the extrinsic polysilicon etch during formation of the emitter opening, an etch stop layer of dielectric materials such as oxide must be disposed underneath the extrinsic base polysilicon. This etch stop layer cannot cover the whole extrinsic base region, however, in order to form an electrical contact between the raised extrinsic base and the underneath base 25. Therefore, a need remains for a feasible approach to achieve those required features with CMOS circuit integration capability.

The deficiencies of the conventional methods show that a need still exists for an improved process of fabricating an HBT with a raised extrinsic base. To overcome the shortcomings of the conventional methods, a new process is provided. An object of the present invention is to form an HBT with a raised extrinsic base by CMP integrated in a CMOS circuit. A related object is to properly design the thickness of the emitter sacrificial plug and the CMOS gate stack so that the two structures have the same height across the entire wafer, with a flat top surface, to serve as a polish-stop layer for the formation of the raised extrinsic base as well as the isolation dielectric layer by CMP.

Another related object is to provide a fabrication process including a specific layer sequence and predetermined range of layer thicknesses for the HBT with a raised extrinsic base formed by CMP integrated in a CMOS circuit. Still another object of the present invention is to provide a process in which the CMOS gate dielectric stack is designed to form a flat surface aligned with the HBT emitter plug. Finally, a general object of the present invention is to provide a process sequence to form an entire BiCMOS circuit incorporating CMP process steps.

SUMMARY OF THE INVENTION

To achieve these and other objects, and in view of its purposes, the present invention provides a process for forming a bipolar transistor with a raised extrinsic base, an emitter, and a collector integrated with a complementary metal-oxide-semiconductor (CMOS) circuit with a gate. An intermediate semiconductor structure is provided having a CMOS area and a bipolar area. An intrinsic base layer is provided in the bipolar area. A base oxide is formed across, and a sacrificial emitter stack of silicon layer (referred to below as an emitter stack silicon layer) is deposited on, both the CMOS and bipolar areas. A photoresist is applied to protect the bipolar area and the structure is etched to remove the emitter stack silicon layer from the CMOS area only such that the top surface of the emitter stack silicon layer on the bipolar area is substantially flush with the top surface of the CMOS area. Finally, a polish stop layer is deposited having a substantially flat top surface across both the CMOS and bipolar areas suitable for subsequent chemical-mechanical polishing (CMP).

Two specific embodiments of the present invention are possible, depending upon the relative thicknesses of the various layers. In the first embodiment, the thickness of the emitter stack silicon layer is approximately equal to the thickness of the silicon gate of the CMOS area. The process then uses the base oxide as an etch stop such that the top surface of the emitter stack silicon layer on the bipolar area is substantially flush with the top surface of the base oxide in the CMOS area.

In the second embodiment, the thickness of the emitter stack silicon layer plus the thickness of the intrinsic base layer is approximately equal to the thickness of the silicon gate of the CMOS area. The process then includes the step of etching to remove both the emitter stack silicon layer, the base oxide, and the intrinsic base layer from the CMOS area only, with a CMOS protective layer acting as an etch stop. This step assures that the top surface of the emitter stack silicon layer on the bipolar area is substantially flush with the top surface of the protective layer in the CMOS area.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

CMP has been extensively used to form the shallow trench isolation (STI) and the back-end-of-line (BEOL) isolation regions during semiconductor fabrication. Conventional processes have not addressed, however, using CMP to achieve planarization for silicon devices fabricated in a BiCMOS circuit with different topography between the bipolar and CMOS areas. The formation of the STI uses a dielectric layer as the polish stop, which is deposited directly onto the flat surface of a silicon substrate in the early stage of the wafer processing In the process of the present invention, the extrinsic base layer is deposited over an emitter sacrificial plug. The extrinsic base can be polycrystalline silicon, or "PC" silicon, which is often referred to as "polysilicon." The thicknesses of the sacrificial plug and the rest of the CMOS area are properly adjusted so as to achieve a pre-polish flat surface for planarization by CMP. The major differences between the process of the present invention and conventional methods of forming the raised extrinsic base by CMP for an HBT integrated in a CMOS circuit are (a) the extrinsic base layer in the present invention is deposited over an emitter sacrificial plug, and (b) the sacrificial plug and the rest of the CMOS areas have their thicknesses properly adjusted to achieve a pre-polish flat surface for CMP planarization. The detailed steps of the process according to the present invention, for fabricating the bipolar device with a raised extrinsic base by CMP integrated into a CMOS circuit, are provided below.

Figure 1A:
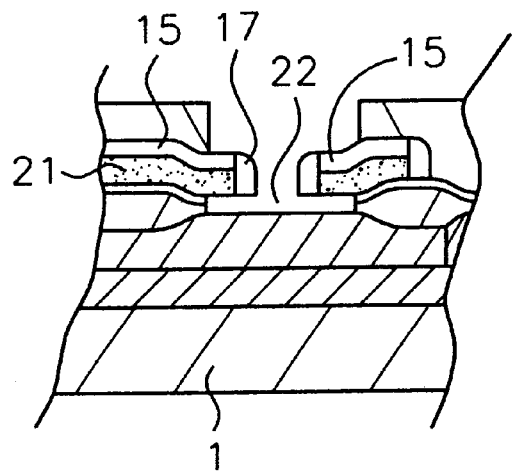
FIGS. 1A and 1B correspond to a portion of FIGS. 7C and 7E, respectively, of U.S. Pat. No. 5,523,606.
Figure 1B:
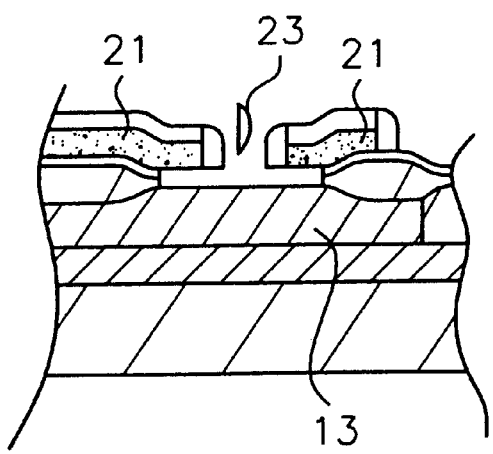
Figure 2A:
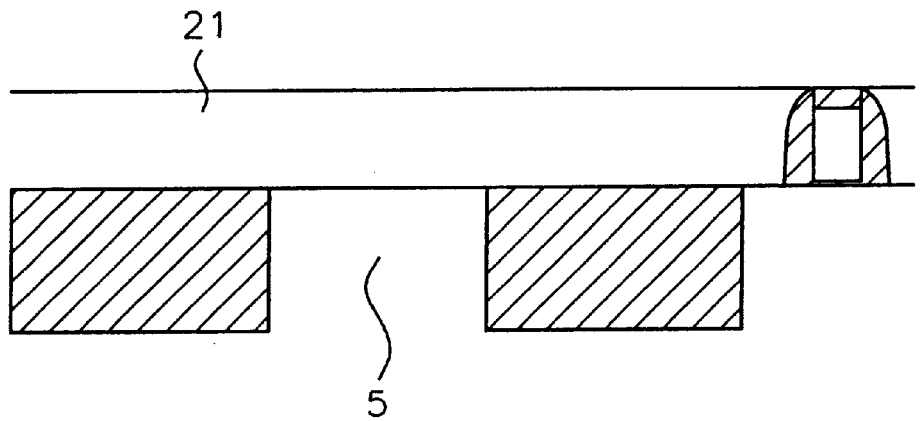
FIGS. 2A and 2B correspond to FIG. 1 of an article by Y. C. Sun and J. Warnock, "Process for a High-Performance Bipolar-Based BICMOS," IBM Technical Disclosure Bulletin, vol. 35, no. 4B, pages 295–97 (September 1992)
Figure 2B:
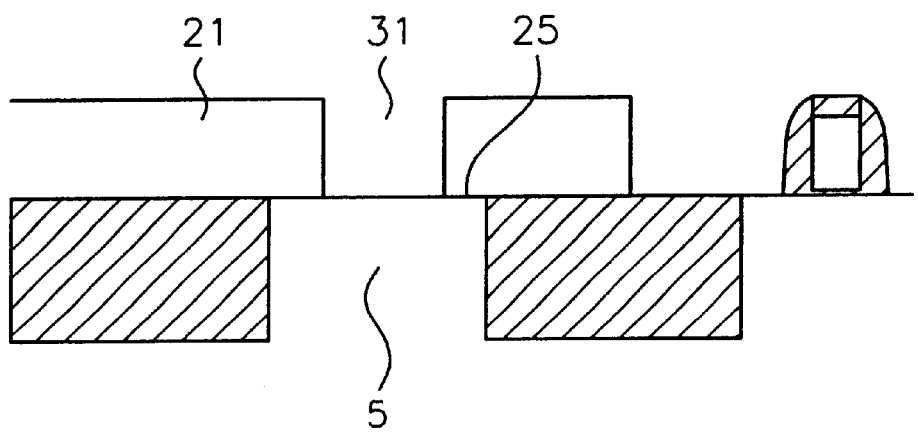
Figure 3:
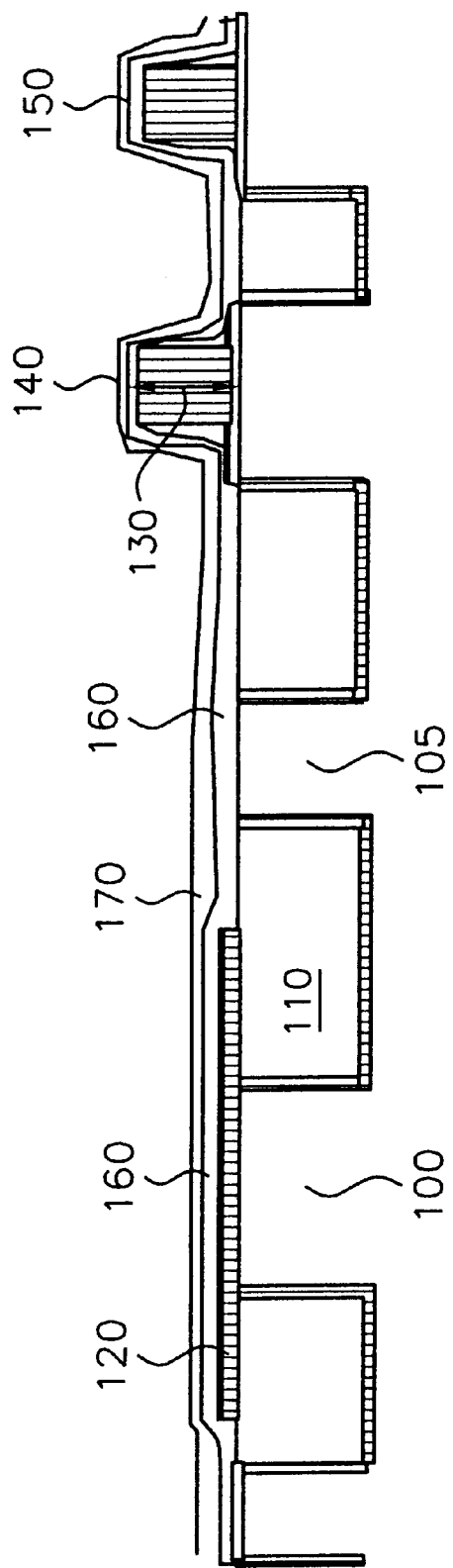
FIG. 3 shows the structure that results following application of the first three steps of the process of the present invention.

Referring now to the drawing, in which like reference numbers refer to like elements throughout, FIG. 3 shows the result of the first three steps of the process of the present invention. The starting structure includes a silicon active area 100 with a dielectric-filled isolation region 110 and a buried collector region 105. A protective layer 120 is deposited and opened for CMOS fabrication. The protective layer 120 protects the bipolar area. Although the bipolar area is an NPN-type in the example described, the bipolar area is not limited to that type. This completes the first step of the process.

In a second step, conventional CMOS devices (including a PFET 140 and an NFET 150) are fabricated, with p-well and n-well implantation followed by appropriate threshold voltage adjustment doping. The gate dielectric is formed, then the gate conductor 130 is deposited. In a third step, a protective dielectric layer 160 is deposited to provide CMOS protection. An optional layer 170 may be deposited to facilitate nucleation of the subsequent base. These first three steps yield the structure illustrated in FIG. 3.

Figure 4:
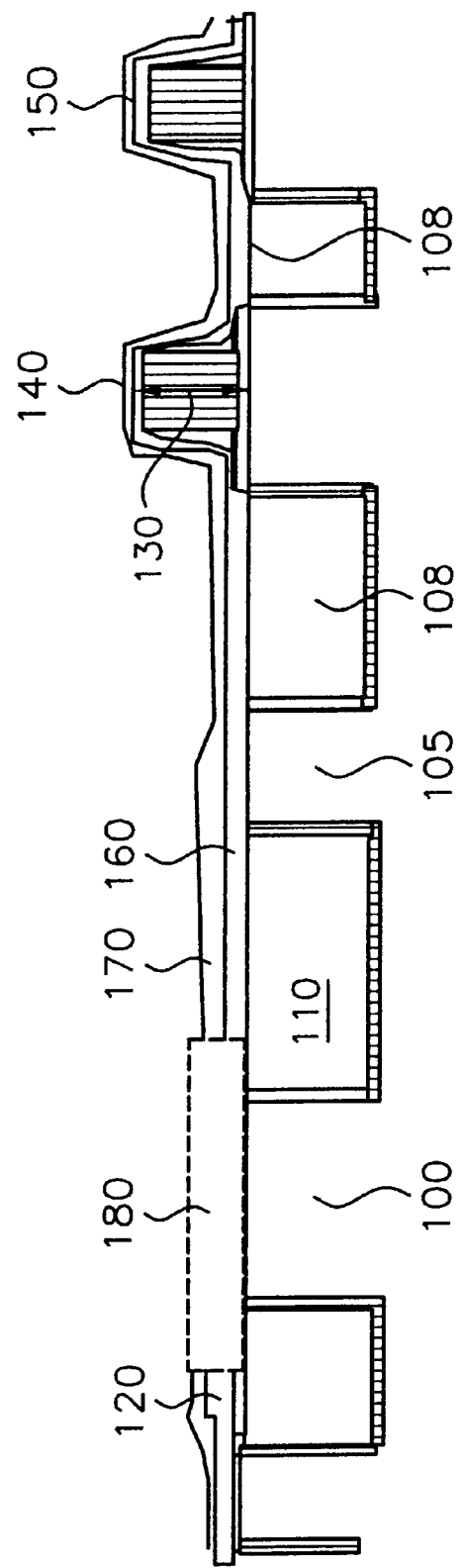
FIG. 4 illustrates the fourth step of the process of the present invention, highlighting several types of areas having different topographies.

These steps are followed by opening up a bipolar region using conventional photolithography and by etching the protective layers 170, 160, and 120, as shown in FIG. 4. FIG. 4 also shows the STI area 108 and the base opening 180.

Figure 5:
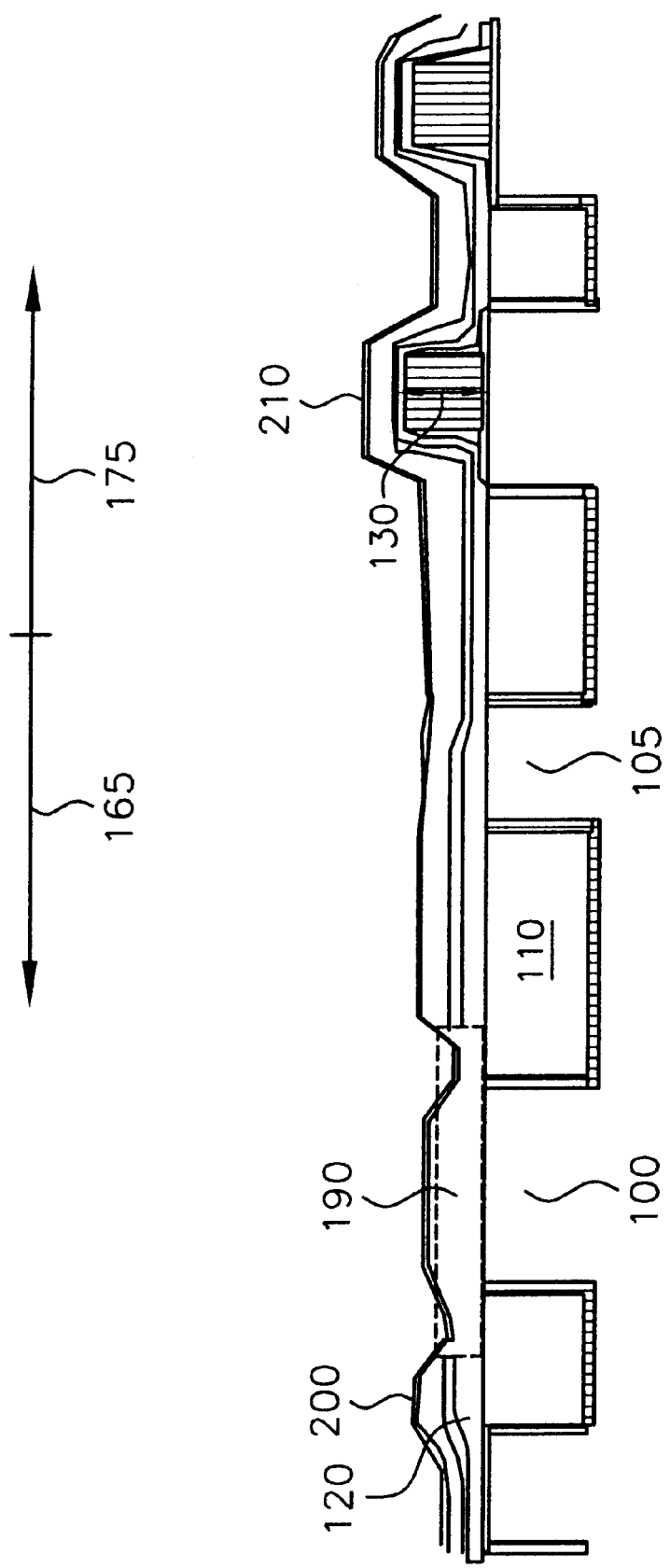
FIG. 5 illustrates the fifth step of the process of the present invention, highlighting the clear difference in the topography (a step) between the CMOS area and the bipolar area.

As shown in FIG. 5, the epitaxial SiGe base 190 is deposited using techniques well known to those skilled in the art. A thin layer (typically less than 50 nm) of a dielectric such as an oxide may be formed for passivation. The deposition of epitaxial SiGe base 190 and the formation of base passivation layer 200 are conventional and well known to the artisan. FIG. 5 highlights the clear difference in the topography, step 210, between the CMOS area 175 and the bipolar area 165. The step 210 is approximately equal to the height (1,000–2,500 Å) of the gate conductor 130.

Figure 6:
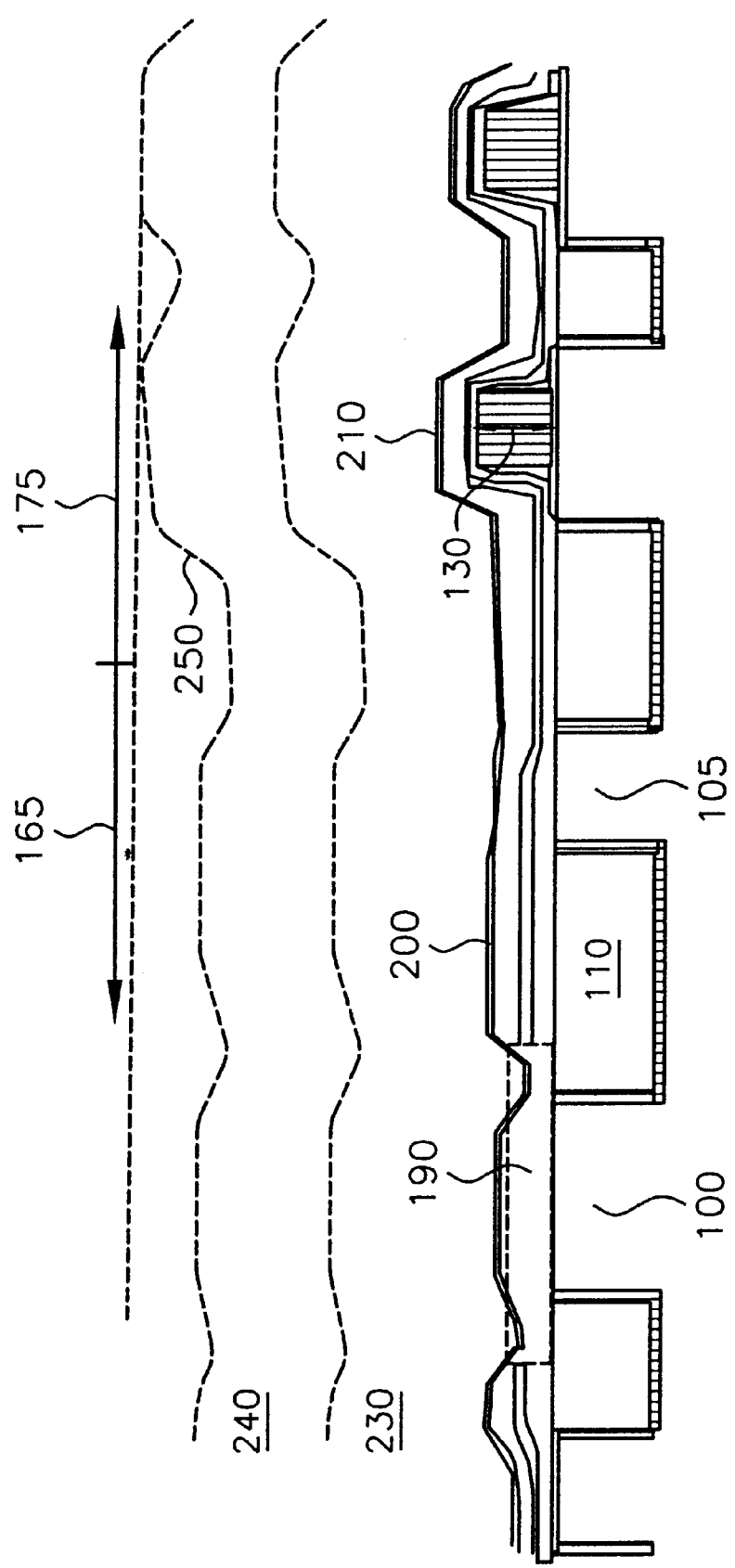
FIG. 6 highlights the different topography between the bipolar and CMOS areas after deposition of the emitter stack silicon and SiN polish stop layers, rending it impractical to planarize the bipolar area to form the raised extrinsic base with a good polish stop.

FIG. 6 highlights the different topography between the bipolar and CMOS areas. After the base oxide 200, a stack of a-Si layer 230 and a SiN layer 240 is deposited, each layer about 500–2,000 Å and preferably 1,000–1,500 Å in thickness. The SiN layer 240 will be used as the polish stop for the following steps. Note the height difference, step 250, by which the NPN bipolar area 165 is lower than the CMOS area 175. Step 250 is about the same as the CMOS gate thickness (step 210). If the topography remains with the SiN layer 240 standing high on the CMOS area, step 250, it is impractical to planarize the bipolar area 165 to form the raised extrinsic base with a good polish stop: there is no polish stop layer with a flat surface to form the raised extrinsic base via CMP.

The solution resides in providing a pre-polish stop layer with a planar or flat surface across the entire wafer, taking into account the different topography between the CMOS and NPN areas as shown in FIG. 6. A pre-polish flat surface is provided by properly designing the layer sequence and the thicknesses of the deposited materials. Both the layer sequence and the thicknesses are "predetermined" because they are reasonably predictable within a certain range, as opposed to random, and calculated to achieve a desired end product.

To resolve the identified topography issue, the films deposited before the polish stop SiN layer 240 must be flush across the wafer. A flush surface can be realized by a masked etch process. In this process, a photoresist 235 is use to protect the bipolar area 165. The CMOS area 175 is exposed and the films are etched away with a proper etch stop. The next step is deposition of the polish stop SiN layer 240. The top surface of the polish stop SiN layer 240 will be flush across both the CMOS and bipolar areas.

Figure 7:
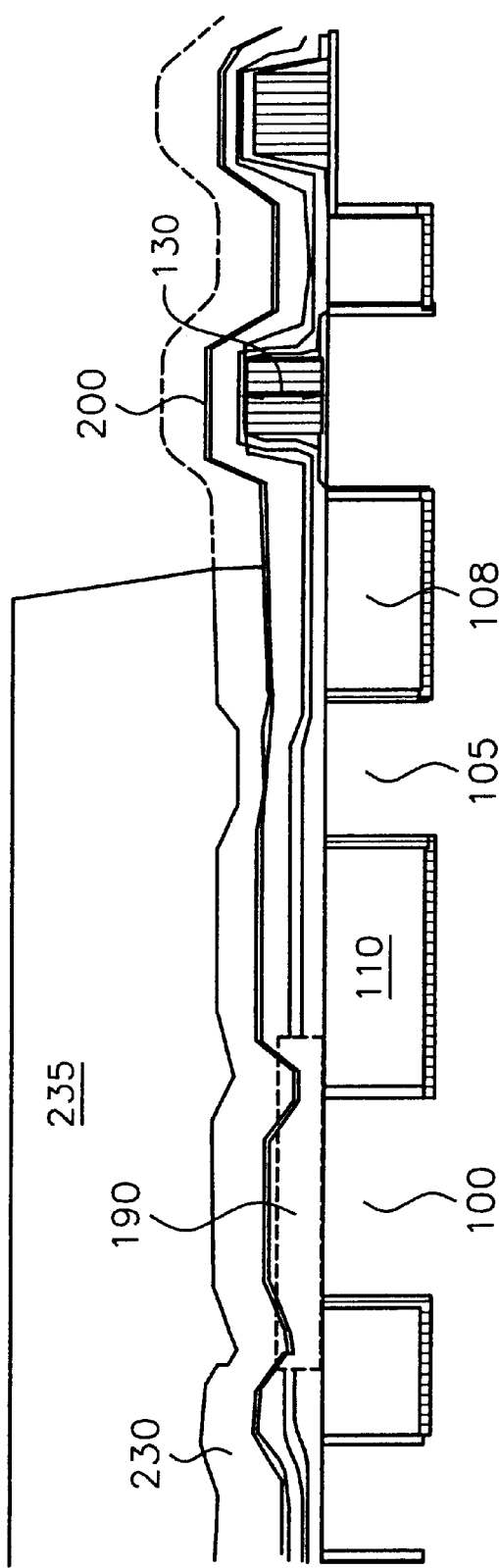
FIG. 7 illustrates a first embodiment of the process according to the present invention, which renders the surface of the a-Si on the bipolar area flush with the top surface of the base oxide in the CMOS area.

There are two options for this process depending on the layer thickness in the structure. The first option is illustrated in FIG. 7, in which the thickness of the a-Si 230 is approximately equal to the thickness of the gate conductor 130. After the base oxide 200 is formed, the emitter stack a-Si 230 is first deposited. The a-Si 230 thickness is chosen so as to be equal to the step height difference delta, the same as the difference between the CMOS stack and the NPN epitaxial SiGe base 190, which is about the same as the gate conductor 130. The photoresist masked etching will stop on the base oxide 200; the a-Si 230 is removed only in the CMOS area 175 by the resist mask etch. The result is that the surface of the a-Si 230 on the bipolar area 165 is flush with the top surface of the base oxide 200 in the CMOS area 175. Therefore, the subsequently formed SiN layer 240 will have a flat top surface across the entire wafer for both the CMOS and bipolar areas.

Figure 8:
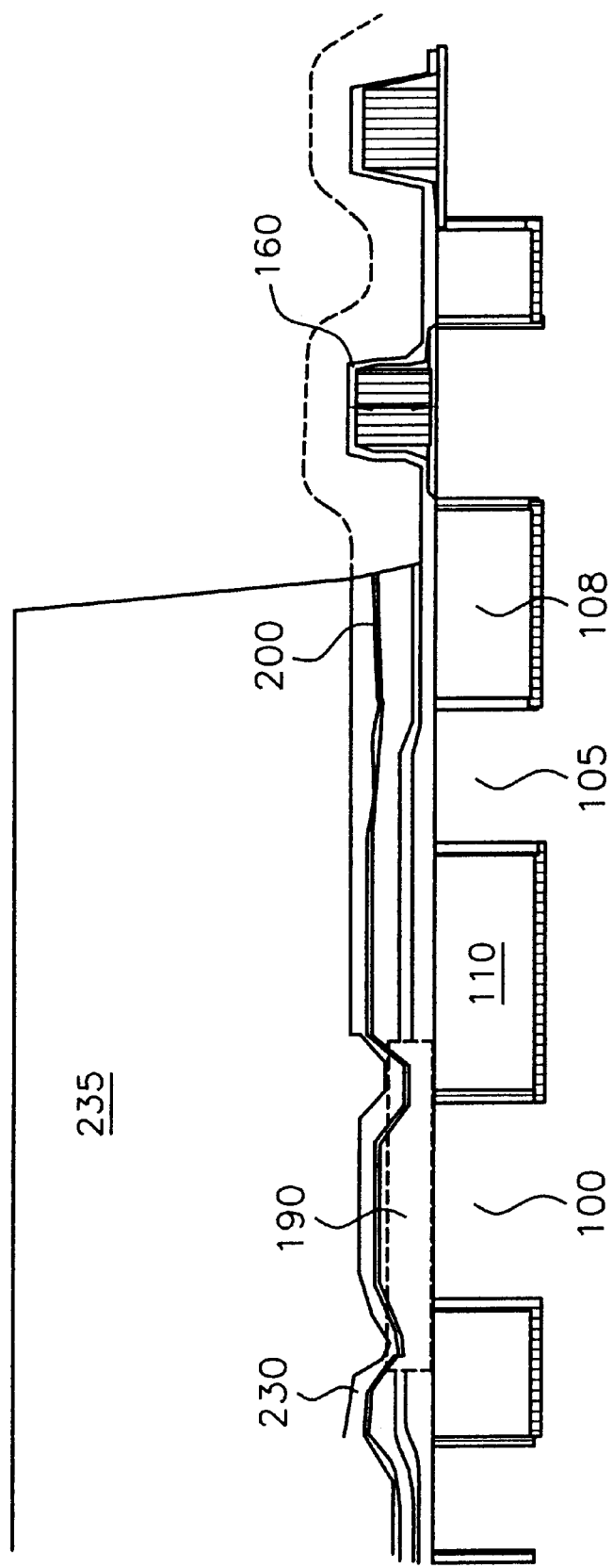
FIG. 8 illustrates a second embodiment of the process according to the present invention, which renders the surface of the a-Si on the bipolar area flush with the top surface of the TEOS layer atop the gate polysilicon in the CMOS area.

The second option is illustrated in FIG. 8, in which the thickness of the a-Si 230 plus the thickness of the epitaxial SiGe base 190 is about equal to the thickness of the gate conductor 130. Because the thickness of the gate conductor 130 is about 2,000 Å, often greater than the thickness of the a-Si 230 of about 500–1,500 Å, it is feasible to etch the a-Si 230 further through the base oxide 200 with the underlying epitaxial SiGe base 190 also removed. The etch will stop on the CMOS protective layer 160. This process requires that the combination of the two films (a-Si 230 and the epitaxial SiGe base 190) have a thickness equal to the gate conductor 130. Therefore, the surface of the a-Si 230 on the bipolar area 165 is flush with the top surface of the CMOS protective layer 160.

Figure 9:
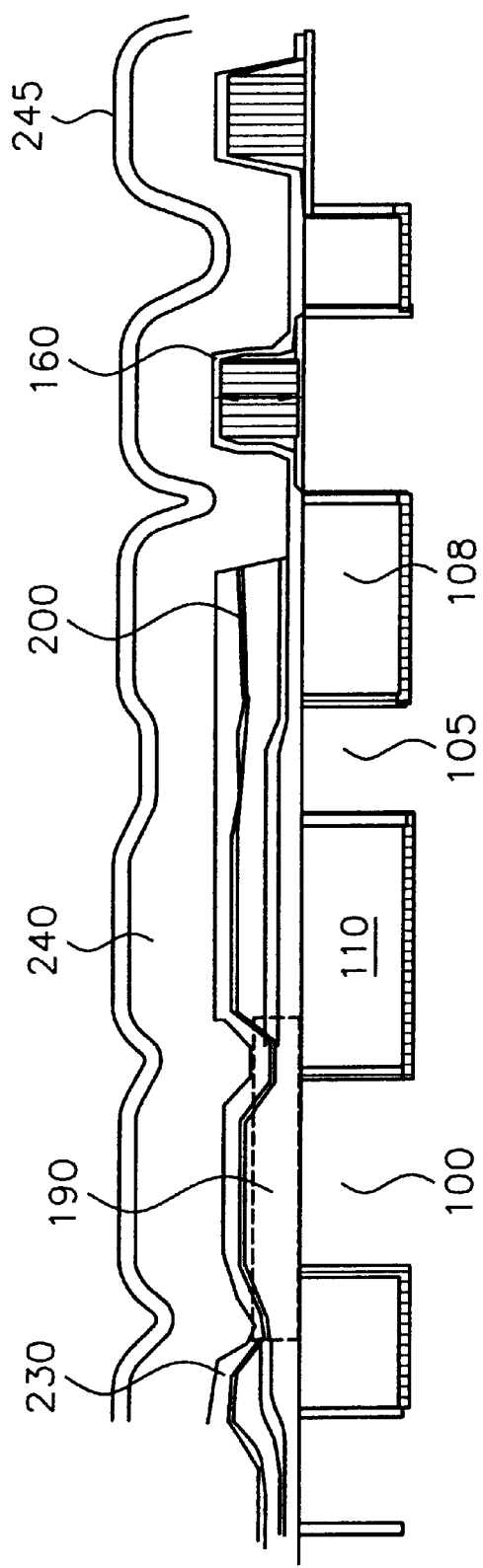
FIG. 9 illustrates the structure of FIG. 8 after a silicon nitride layer is deposited as the polish stop layer.

FIG. 9 illustrates the structure of FIG. 8 after SiN layer 240 is deposited. (An etch stop layer of TEOS 245, about 100–500 Å thick, is optional atop the SiN layer 240.) Note that the top surface of the SiN layer 240 on the bipolar area 165 is flush with the top surface on the CMOS area 175, necessary for the next step CMP.

Because the fabrication process is similar for both options in the following steps, the second option (FIGS. 8 and 9) will be used as an example to discuss the bipolar fabrication. The process steps that would complete the fabrication for the structure of the first option (FIG. 7) can be directly derived based on the discussion below. Such steps would be known to the artisan in view of the example based on the second option.

Figure 10:
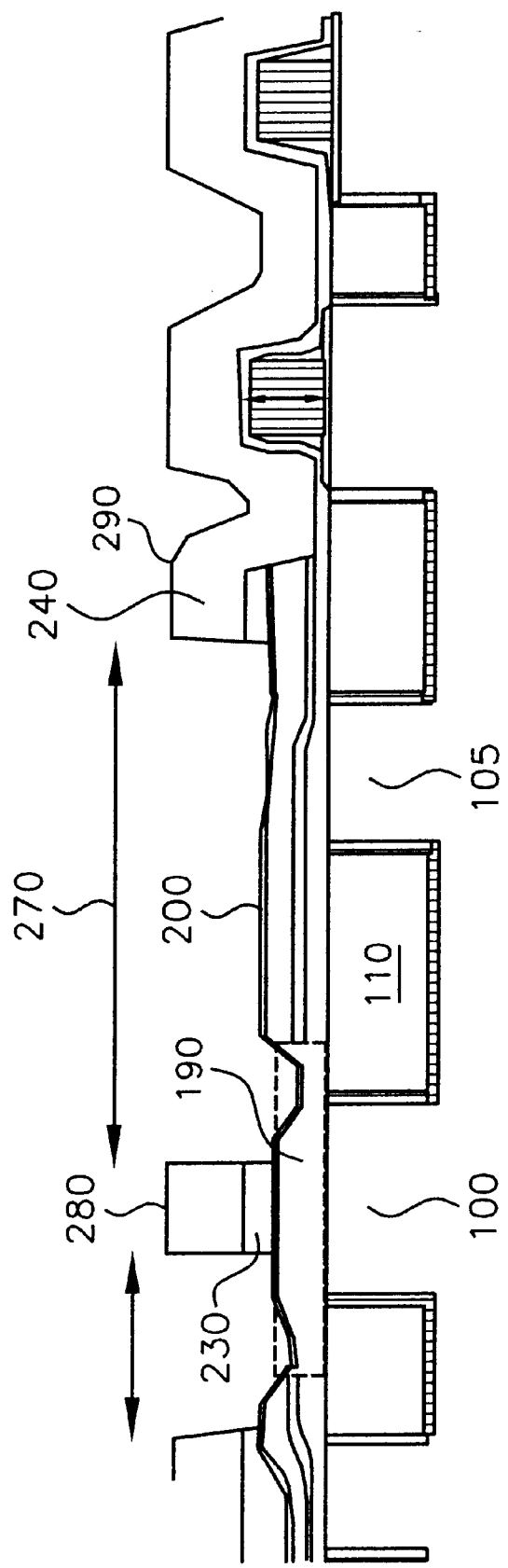
FIG. 10 illustrates the next step of the process according to either embodiment of the present invention, showing formation of an extrinsic base opening through the emitter stack of SiN and a-Si.

In the next step of the process according to the present invention, the extrinsic base opening resist block is coated (not shown). As shown in FIG. 10, the stack RIE of layer 240 and the layer 230 forms an extrinsic base opening 270, leaving an emitter island 280 and a supporting island 290. The RIE step stops at the base oxide layer 200.

Figure 11:
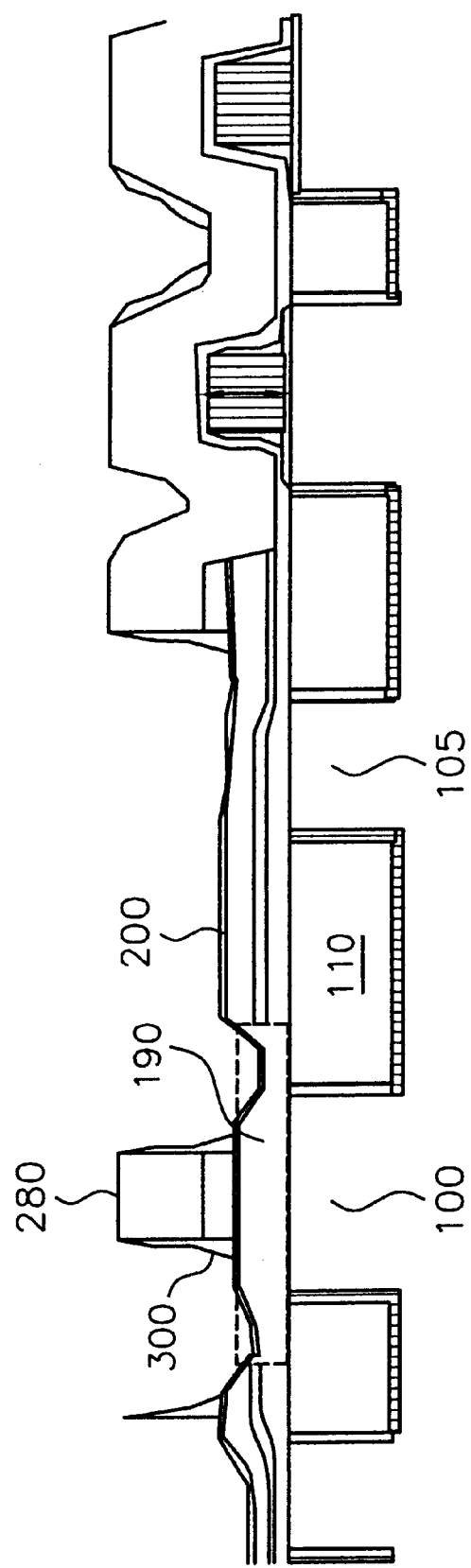
FIG. 11 illustrates formation of a spacer.

As illustrated in FIG. 11, a spacer 300 is formed next. The spacer 300 can be a single or a composite dielectric spacer. The base oxide 200 is stripped in the extrinsic base opening 270. The base oxide 200 on other areas is protected by the emitter island 280 and the supporting island 290.

Figure 12:
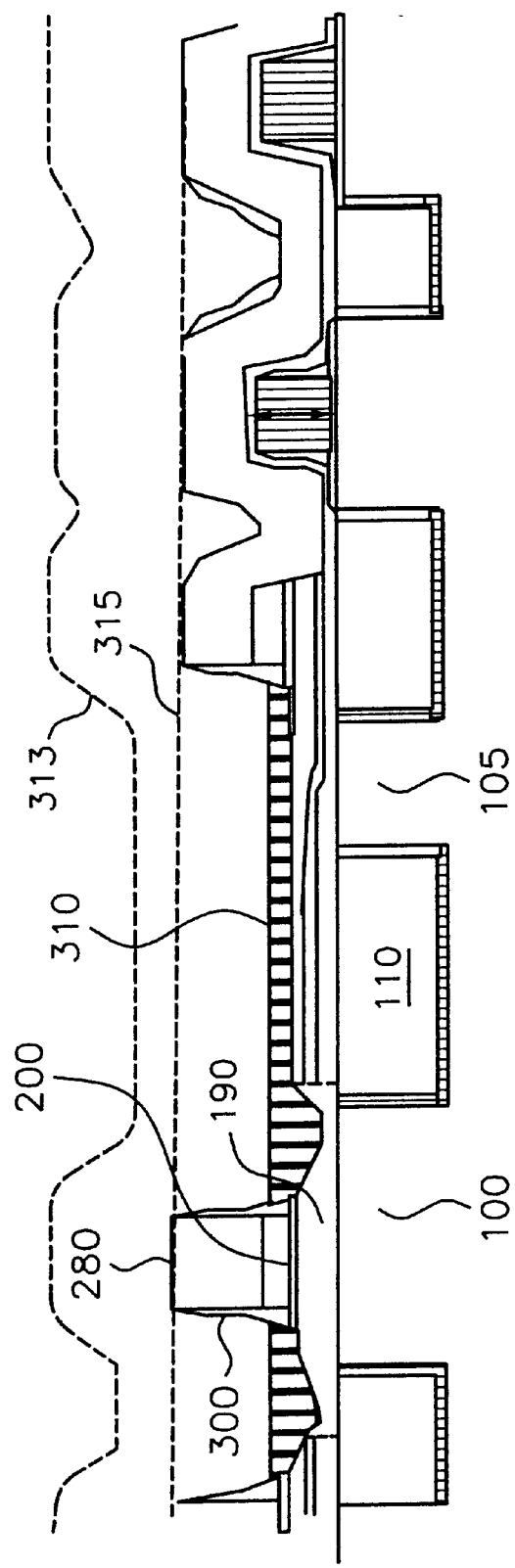
FIG. 12 illustrates removal of the base oxide in the extrinsic base opening and formation of the raised extrinsic base.

FIG. 12 shows that a raised extrinsic base 310 is formed. Extrinsic base 310 is formed, for example, by depositing a polysilicon layer 313 and subsequently planarizing back to a level 315 that fills the extrinsic base opening 270 using layer 240 as the polish stop, followed by recess etching back. The raised extrinsic base 310 can also be formed by selective epitaxy deposition only on the exposed extrinsic base opening 270.

Figure 13:
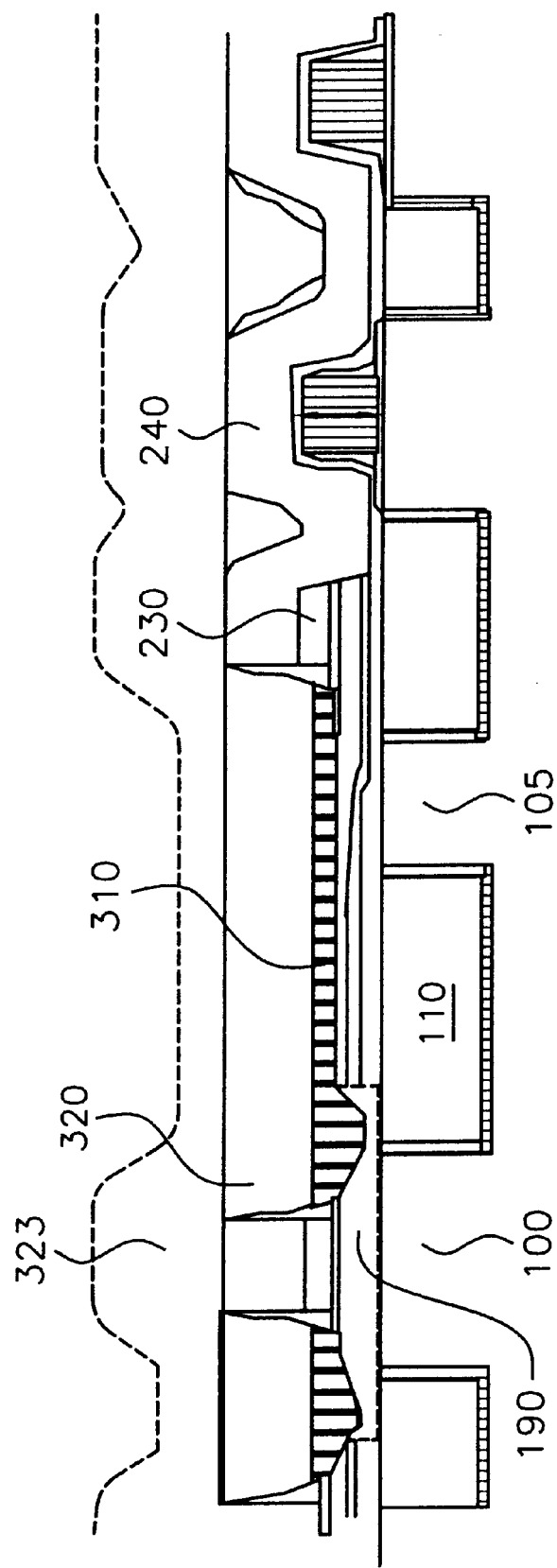
FIG. 13 illustrates formation of a planar isolation layer.

FIG. 13 shows that a dielectric isolation layer 323 is deposited. A CMP step is applied to the isolation layer 323 to planarize that layer, forming planar isolation layer 320. The layer 240 is again used as a polish stop in this step.

Figure 14:
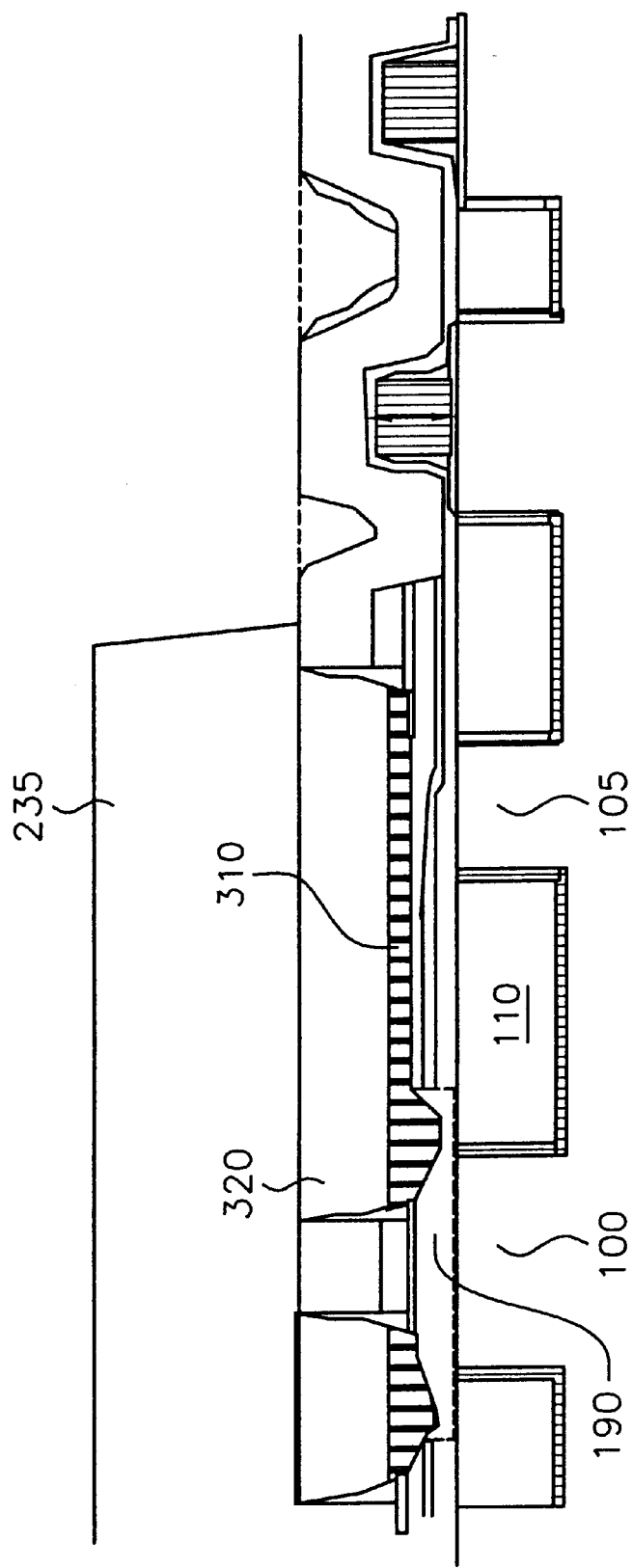
FIG. 14 shows the structure resulting after the planar isolation layer is stripped from the CMOS area.

Next, a photoresist mask of the same image as photoresist 235 can be used to block the bipolar area 165. Then the remaining isolation layer 320 on the CMOS area 175 (along with any residue films from the spacers if applicable) is stripped. The resulting structure is illustrated in FIG. 14.

Figure 15:
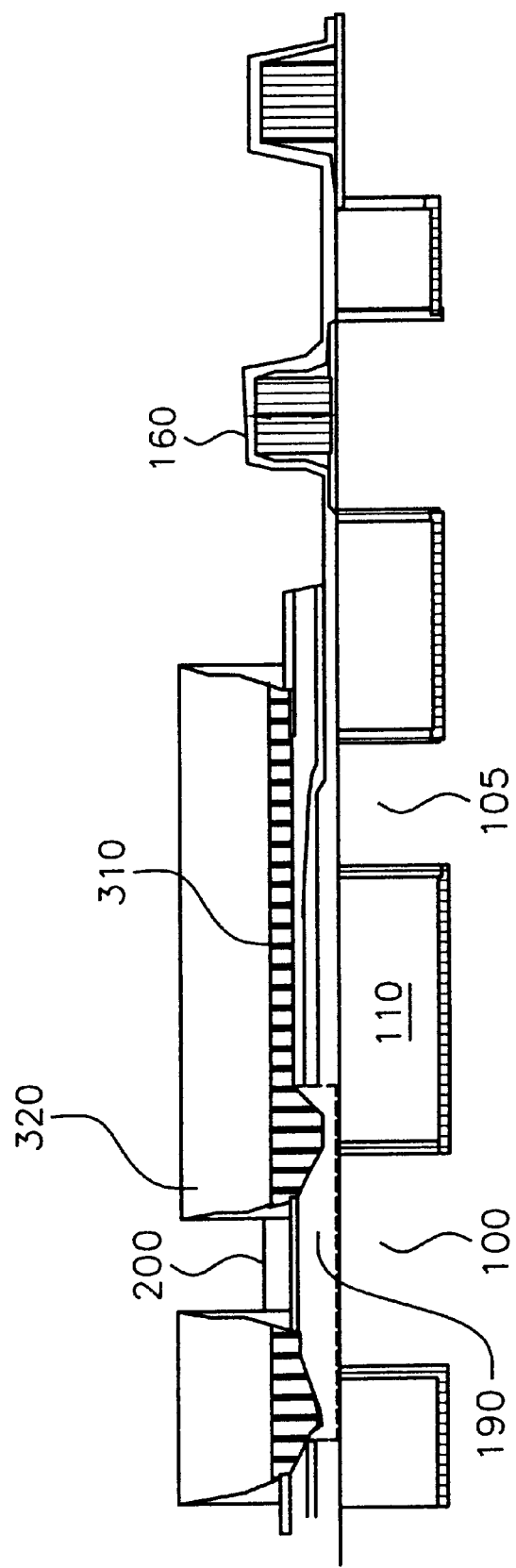
FIG. 15 shows the structure resulting after etching, using the planar isolation layer as a mask, the stack of the silicon nitride layer and the a-Si layer in the emitter island and in the supporting island.

The process of the present invention next uses the planar isolation layer 320 as a mask. The sacrificial stack layers 230 and 240 in the emitter island 280 and in the supporting island 290 are etched away. The etch stops at the protective layer 160 in the CMOS area 175 and at the base oxide 200 in the bipolar area 165. The resulting structure is illustrated in FIG. 15.

Figure 16:
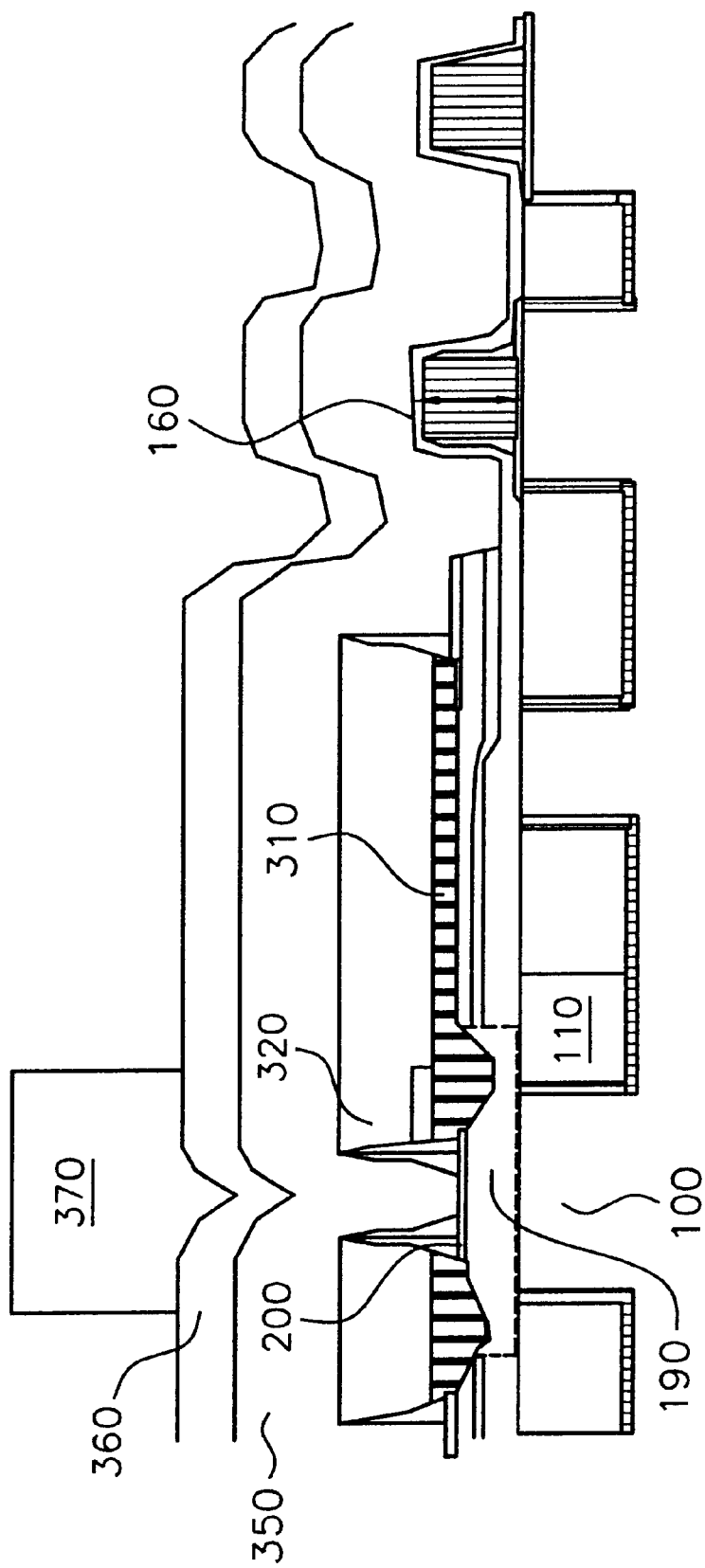
FIG. 16 shows the structure resulting after an emitter polysilicon layer is deposited, a SiN layer is deposited as a mask to form the emitter contact, and a photoresist is coated on the structure.

As shown in FIG. 16, the base oxide layer 200 is etched within the emitter opening and an emitter layer 350 is deposited. Then a dielectric protective layer 360 is deposited as a mask to form the emitter contact. A photoresist 370 is provided to facilitate subsequent processing.

Figure 17:
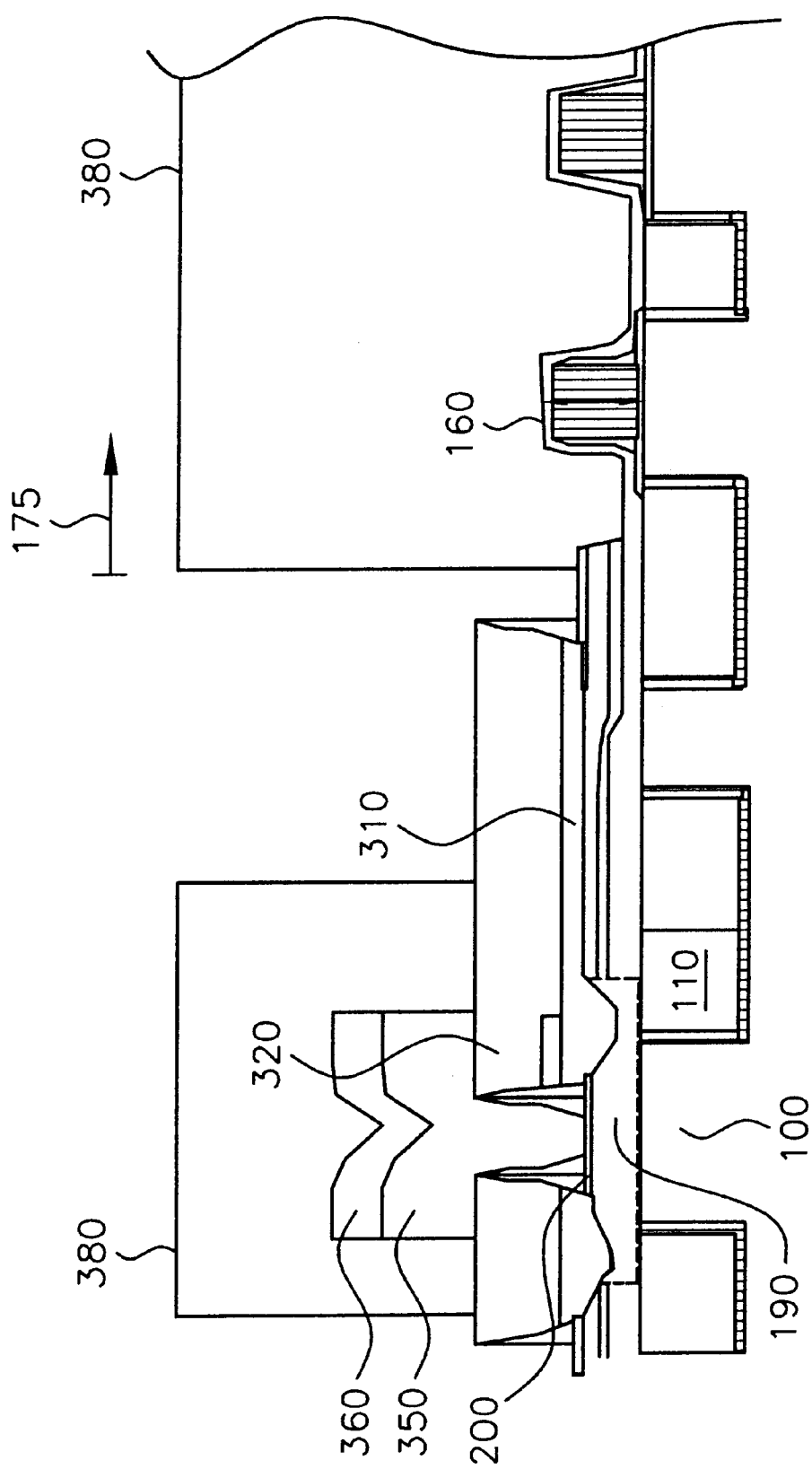
FIG. 17 shows the structure resulting after the SiN layer and the emitter polysilicon layer are removed outside the emitter area, using the photoresist as a mask, and a photoresist layer corresponding to the extrinsic base region and covering the CMOS region is applied.

Using the photoresist 370 as a mask, the dielectric protective layer 360 and the emitter layer 350 are removed outside the emitter area. The planar isolation layer 320 and the CMOS protective layer 160 serve as etch stops. A photoresist layer 380, patterned to cover both the extrinsic base region and the CMOS region 175, is applied as illustrated in FIG. 17 and opened. A directional etch is applied to the exposed regions, first etching oxide isolation layer 320 and base oxide layer 200, then the polysilicon films of raised extrinsic base 310 and NPN epitaxial SiGe base 190, stopping on the protective layer 160. The dielectric protective layer 160 is then removed through wet or dry etch techniques and (optionally) CMOS implants and anneals may take place.

Figure 18:
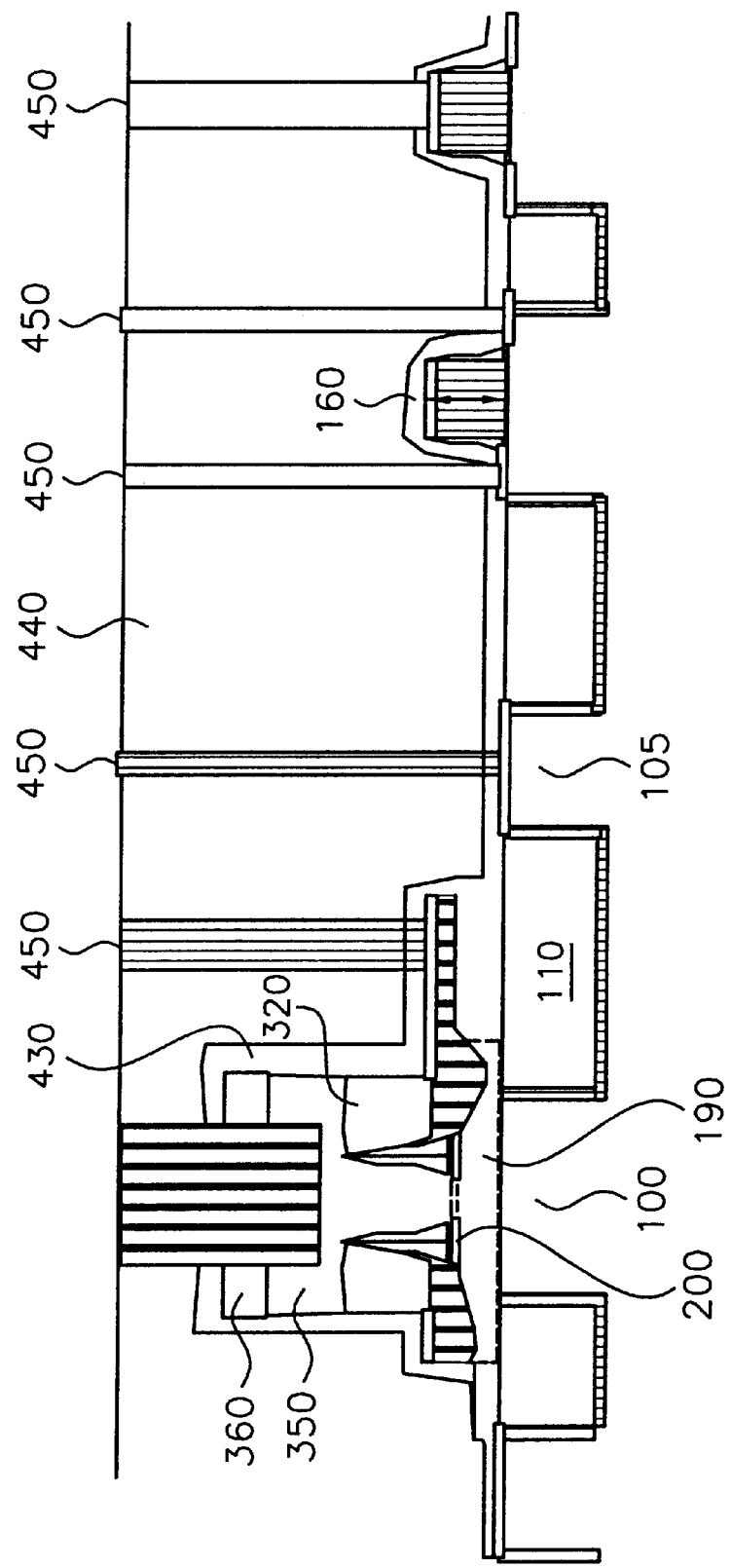
FIG. 18 shows the structure resulting after all of the oxide layers are stripped, a SiN etch stop is deposited, a borophosphosilicate glass layer is deposited and planarized, and the various contacts for the emitter, base, collector, and other components are formed to complete the integration of the structure.

All of the following steps, of forming the contacts to the emitter, base, and collector of the bipolar area 165 and the contacts to the source, drain, and gate of the CMOS area 175, are well-known to the artisan. A SiN etch stop 430 is deposited, followed by deposition and planarization of a borophosphosilicate glass (BPSG) layer 440. The formation of various contacts 450 for the emitter, base, collector, and other components completes the integration of the structure. Such structure is illustrated in FIG. 18.

A number of important differences should now be apparent between the fabrication process of the present invention and the conventional methods. Several major differences exist between the present invention and the disclosure in the article by Y. C. Sun and J. Warnock. Among those differences are: (a) the extrinsic base polysilicon in the present invention is deposited over an emitter sacrificial plug, and (b) the sacrificial plug and the rest of the CMOS areas have their thicknesses properly adjusted to provide a pre-polish flat surface to achieve the CMP planarization. In the referenced article, in contrast, the polish stop is assumed to be the CMOS gate dielectric. In the present invention, the CMOS top surface is no longer the same height as the emitter plug by default, and to achieve this flat surface is one of the important objects of the present invention.

Several major differences also exist between the present invention and the disclosure of U.S. Pat. No. 5,523,606. Two of those differences are highlighted. First, the extrinsic base polysilicon of the present invention is deposited after the intrinsic base formation. Second, the extrinsic base is formed via CMP made possible by proper film stack design to provide a polish stop, and hence no selective epitaxy is necessary for the intrinsic SiGe base.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An intermediate semiconductor structure useful during the process of forming a bipolar transistor with a raised extrinsic base, an emitter, and a collector integrated with a complementary metal-oxide-semiconductor (CMOS) circuit, the structure comprising:
   a bipolar area;
   a CMOS area including a top surface, a gate conductor having a thickness, and a protective layer with a top surface;
   an intrinsic base layer, having a thickness, in the bipolar area;
   a base oxide across both the CMOS and bipolar areas, the base oxide having a thickness;
   an emitter stack silicon layer only on the bipolar area and over the base oxide, the emitter stack silicon layer having a thickness and a top surface substantially flush with the top surface of the CMOS area; and
   a polish stop layer having a substantially flat top surface across both the CMOS and bipolar areas suitable for subsequent chemical-mechanical polishing (CMP).

2. The intermediate semiconductor structure according to claim 1, wherein the thickness of the emitter stack silicon layer is approximately equal to the thickness of the gate conductor of the CMOS area and the top surface of the emitter stack silicon layer on the bipolar area is substantially flush with the top surface of the base oxide in the CMOS area.

3. The intermediate semiconductor structure according to claim 2, wherein the gate conductor has a thickness of 1,000–2,500 Å and the emitter stack silicon layer comprises:
   (a) an a-Si layer having a thickness of 500–2,000 Å; and
   (b) a SiN polish stop layer having a thickness of 500–2,000 Å.

4. The intermediate semiconductor structure according to claim 1, wherein the thickness of the emitter stack silicon layer plus the thickness of the intrinsic base layer is approximately equal to the thickness of the gate conductor of the CMOS area and the top surface of the emitter stack silicon layer on the bipolar area is substantially flush with the top surface of the protective layer in the CMOS area.

5. The intermediate semiconductor structure according to claim 4, wherein the gate conductor has a thickness of 1,000–2,500 Å and the emitter stack silicon layer comprises:
   (a) an a-Si layer having a thickness of 500–2,000 Å; and
   (b) a SiN polish stop layer having a thickness of 500–2,000 Å.

6. The intermediate semiconductor structure according to claim 1, wherein the polish stop layer is a dielectric.

7. The intermediate semiconductor structure according to claim 1, wherein the bipolar transistor is a heterojunction bipolar transistor and the intrinsic base layer is silicon-germanium.

8. The intermediate semiconductor structure according to claim 1, wherein the emitter stack silicon layer comprises:
   (a) an a-Si layer having a thickness of 500–2,000 Å; and
   (b) a SiN polish stop layer having a thickness of 500–2,000 Å.

* * * * *